United States Patent
Mo et al.

(10) Patent No.: US 11,913,772 B2
(45) Date of Patent: Feb. 27, 2024

(54) NON-DESTRUCTIVE GAP METROLOGY

(71) Applicant: Intel Corporation, Santa Clara, CA (US)

(72) Inventors: Jianyong Mo, Chandler, AZ (US); V Wade Singleton, Gilbert, AZ (US); Yiren Wu, Chandler, AZ (US); Liang Zhang, Chandler, AZ (US); David Wasinger, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/696,980

(22) Filed: Mar. 17, 2022

(65) Prior Publication Data

US 2023/0296371 A1 Sep. 21, 2023

(51) Int. Cl.
*G01B 11/06* (2006.01)
*G01B 11/30* (2006.01)

(52) U.S. Cl.
CPC .............. *G01B 11/06* (2013.01); *G01B 11/30* (2013.01)

(58) Field of Classification Search
CPC ...................................................... G01B 11/30
USPC ........................................................ 356/503
See application file for complete search history.

(56) References Cited

U.S. PATENT DOCUMENTS

| | | | |
|---|---|---|---|
| 2010/0188499 A1* | 7/2010 | Amanullah | G01N 21/9501 348/87 |
| 2013/0228015 A1* | 9/2013 | Wimplinger | H01L 22/12 73/632 |
| 2018/0080765 A1* | 3/2018 | Cyr | H01L 24/17 |

FOREIGN PATENT DOCUMENTS

CN 101050946 A * 10/2007

* cited by examiner

*Primary Examiner* — Michael A Lyons
*Assistant Examiner* — Omar H Nixon
(74) *Attorney, Agent, or Firm* — Viering, Jentschura & Partner mbB (57) ABSTRACT

The present disclosure is directed to a metrology system having 3-dimensional sensors for thickness measurements of semiconductor elements, and methods for taking the thickness measurements. In an aspect, the 3-dimensional sensor may be a single or dual 3-dimensional profiler that may scan across the top and bottom surfaces of an element to obtain a thickness measurement. In another aspect, the method may be used to measure a gap between elements that have assembled together.

19 Claims, 6 Drawing Sheets

NON-DESTRUCTIVE GAP METROLOGY

BACKGROUND

The use of surface mounting techniques for the assembly of products is required in a variety of industries. The manufacturing and assembly process typically requires assembly planning, quality assurance, and failure analysis as part of the standard operating procedures to ensure high yields. Although not considered a "value-add" step, it may be necessary to perform thickness measurements, gap analysis, stress analysis, and/or warpage evaluation to avoid post-assembly problems. Such problems may result from the properties of the component elements or parts being assembled and/or the methods and techniques used in the assembly.

In the semiconductor packaging industry, for example, it may be critical to know the gap between two silicon dies, two substrates, or a die and a substrate. Such "chip gaps" may directly impact yields and the electrical joint reliability of solder balls and bumps. It is possible to have a severe chip gap variation that leads to solder ball bridging, non-contact openings, and other assembly defects.

Present visual inspection and advanced optical microscopy techniques, while very effective for larger structural dimensions, may have limited usefulness for extremely small, dense semiconductor devices. For semiconductors, scanning electron microscopy (SEM) and other advanced magnification tools may be used for inspection of miniature packages, but generally are not suitable for assembly systems because of size limitations. While 2D/3D X-ray systems may be able to separate layers and enable better defect detection of solder joints and other package/assembly anomalies, there is a general consensus that 2D/3D X-Ray systems may be too slow (e.g., several minutes per view) to provide complete scans on a continuous basis. In addition, the use of 2D/3D X-ray systems may damage certain types of silicon devices (e.g., DRAMS), and also, they have inherent safety concerns associated with their use. Accordingly, the assembly processes for semiconductor packaging may benefit from additional techniques and systems for obtaining accurate and timely data for chip gap measurements.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

The following detailed description refers to the accompanying drawings that show, by way of illustration, specific details, and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

For the measurement of thicknesses of elements or components in the assembly of devices and products, the present disclosure is directed to a method for determining first thickness measurements for a first element, second thickness measurements for a second element, and assembled thickness measurements, which is an assembly of the first and second elements and, after assembly, may include a first gap formed between the first and second elements. The method is further directed to generating a first gap measurement map based on the differences between the assembled thickness measurements and the sum of the individual first and second thickness measurements, for which the first, second, and assembled thickness measurements used to generate the first gap measurement map correspond to locations on the first, second, and assembled elements, respectively, that are in vertical alignment. In addition, the present method may use 3-dimensional profilers to scan surfaces of the first element, second element, and assembled element, respectively, in determining the first thickness measurements, the second thickness measurements, and the assembled thickness measurements.

The present disclosure is also directed a metrology system, which may be particularly used for gap measurements and analyses, having an element handling system for positioning elements for thickness measurements, at least one 3-dimensional thickness sensor configured to obtain thickness measurements for a first element and a second element, respectively, and configured to obtain assembled thickness measurements for an assembled element, which may be formed by the first element and the second element, a memory device coupled to the 3-dimensional thickness sensor for storing thickness measurements provided by the 3-dimensional thickness sensor, and a computing device coupled to the memory device, wherein the computing device is configured to provide data relating to the difference between the assembled thickness measurements and the sum of the individual first and second thickness measurements, and to generate gap measurement maps.

The present disclosure is directed to a further method for conveying a first element to a first thickness measurement tool with at least one first 3-dimensional thickness sensor and scanning the first element using the first 3-dimensional thickness sensor to obtain thickness measurements for the first element, conveying a second element to a second thickness measurement tool with at least one second 3-dimensional thickness sensor and scanning the second element using the second 3-dimensional thickness sensor to obtain thickness measurements for the second element. This method further includes forming an assembled element using the first and second elements that forms a gap between the first and second elements and conveying the assembled element to a third thickness measurement tool with at least one third 3-dimensional thickness sensor and scanning the assembled element using the third 3-dimensional thickness sensor to obtain a thickness measurement for the assembled element.

In addition, this method provides for storing the thickness measurements for the first and second elements and the assembled element in a memory device and provides a computing device coupled to the memory for determining a gap measurement for the gap based on the difference between the thickness measurements for the assembled element and the sum of the individual thickness measurements for first and second elements and generating gap measurement maps.

For the assembly of semiconductor packages, according to the present disclosure, the technical advantages of the present metrology system and method include the measurement of thickness for various semiconductor elements by a non-contact, 3-dimensional thickness sensor that is non-destructive, so as compared with 3D X-ray methods, and suitable for memory die inspection, such high bandwidth memory (HBM) products. Another advantage of the present disclosure is the speeds at which the scans for the various pre-assembled elements and assembled elements may be performed; for example, a chip gap thickness measurement for the entire bump field may be completed within a few seconds. A further advantage of the present metrology system and method includes the ability to provide inline inspection monitoring during an assembly of a semiconductor package or printed circuit board for improved quality control. Another further advantage of the present disclosure is that the present method for obtaining gap thickness measurements may not be impacted by the warpage of one or more of the pre-assemble elements and/or the assembled element since individual thickness measurements are performed.

To more readily understand and put into practical effect, the present thickness measurement systems and methods, which may be used for the thickness measurement of gaps between elements, particular aspects will now be described by way of examples provided in the drawings that are not intended as limitations. The advantages and features of the aspects herein disclosed will be apparent through reference to the following descriptions relating to the accompanying drawings. Furthermore, it is to be understood that the features of the various aspects described herein are not mutually exclusive and can exist in various combinations and permutations. For the sake of brevity, duplicate descriptions of features and properties may be omitted.

Figure 1:
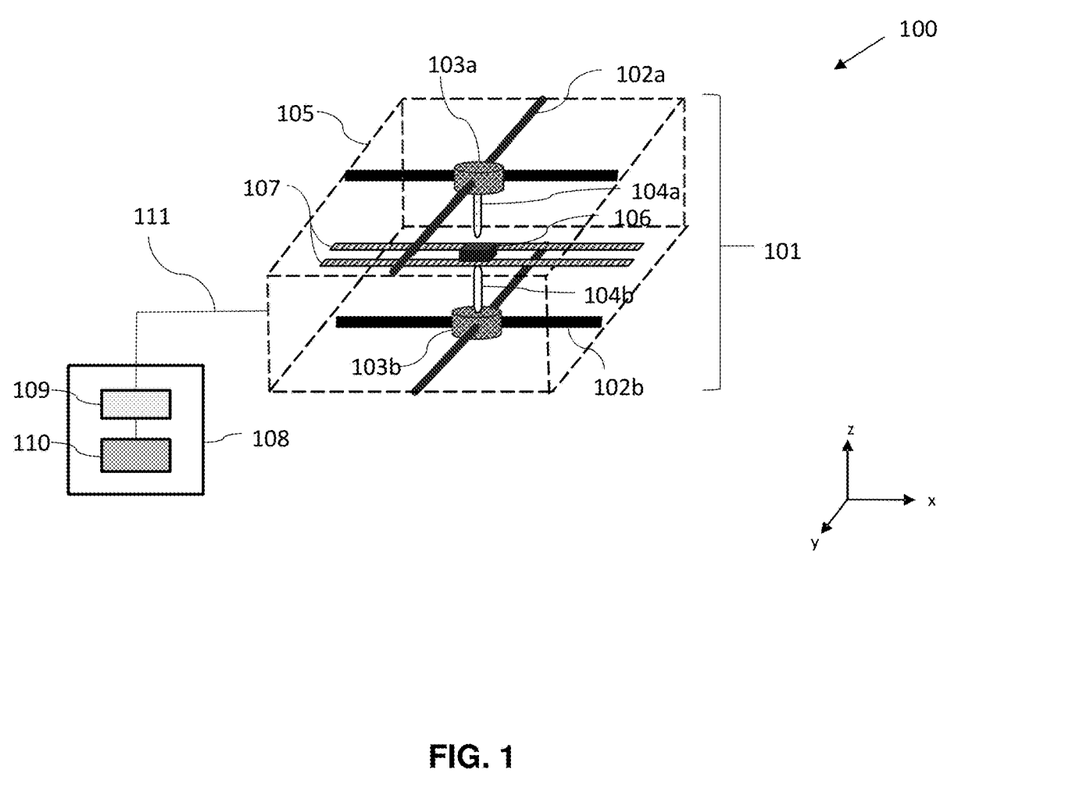
FIG. 1 shows a schematic view of an exemplary metrology system according to an aspect of the present disclosure.

In FIG. 1, a schematic view of an exemplary metrology system 100 according to an aspect of the present disclosure is shown. In this aspect, the metrology system 100 may include a thickness measurement tool 101 having upper and lower gantry supports 102a and 102b, upper and lower sensor maneuvering mechanisms 103a and 103b, and upper and lower non-contact 3 dimensional (3D) profilers 104a and 104b (e.g., 3-dimensional thickness sensors) that may be placed in housing 105. In addition, FIG. 1 shows the metrology system 100 may include a computing device 108 having a controller or processor 109 and memory or data storage device 110, which are connected to the thickness measurement tool 101.

In an aspect, the upper gantry supports 102a provides a structure that holds and enables the rapid movement of the 3D profiler/sensor 104a in an x-y plane over a top surface of an element 106, while the lower gantry supports 102b provides a structure that holds and enables the rapid movement of the 3D profiler/sensor 104b in an x-y plane over a bottom surface of an element 106. In this aspect, the present metrology system and method provide a pair of 3-dimensional profilers to simultaneously scan top surfaces and bottom surfaces of the first element, second element, and assembled element, respectively, to determine the first thickness measurements, the second thickness measurements, and the assembled thickness measurements. In accordance with the present disclosure, depending on the type of thickness sensor used in a metrology system and if both surfaces of an element require scanning, it may be necessary to use only a single 3D profiler/sensor, which may be positioned either above or below the element to be scanned. In another aspect, a gantry support may be configured to enable a single 3D profiler/sensor to move to positions above and below an element (not shown) or the element may be flipped over to sequentially perform the scans of the top and bottom surfaces of the element. Thereafter, the top and bottom scan measurements by the single 3D profiler are combined to generate a thickness measure for the element.

In an aspect, the upper and lower sensor maneuvering mechanisms 103a and 103b, respectively, may be configured for moving the 3D profilers/sensors 104a and 104b along the gantry supports 102a and 102b in the x-y directions when a scan is performed using the thickness measurement tool 101. In another aspect, the upper and lower sensor maneuvering mechanisms 103a and 103b may be configured to have subcomponents (not shown) to move, respectively, the 3D profilers/sensors 104a and 104b in the z-direction to adjust the distance between the 3D profilers/sensors 104a and 104b and the surfaces of the element 106.

In an aspect, the height of a 3D profiler/sensor may be adjusted to accommodate the differences in thicknesses of various types of elements, when conducting scans using the present metrology system. In addition, it may be preferable to minimize the height of the non-contact sensor in the z-direction to be as close to the scanned surface as possible. In yet another aspect, a height/distance for a non-contact probe to be positioned from a surface of an element may be in a range of approximately 0.5 mm to 200 mm.

It is within the scope of the present disclosure to enable the movement of the gantry support 102a and 102b and the sensor maneuvering mechanisms 103a and 103b using conventional mechanical drive mechanisms (e.g., gear, pulley, and lift systems, servo motors, and other electronic circuitry). In addition, the mechanical drive mechanisms of the present disclosure will be able to provide the required precision and repeatability to move the non-contact 3D profiler/sensor to collect data at each location of an element.

As shown in FIG. 1, the metrology system 100 provides for dual 3D profilers/sensors 104a and 104b are fixed directly opposite to each other on their respective gantry supports 102a and 102b to measure the element 106 from both sides. In this configuration, the dual 3D profilers/sensors 104a and 104b (e.g., dual thickness lasers) may provide non-contact measurements that occur at the same time, and due to their synchronization, may eliminate or minimize the effects vibration of the element during a scan and result in more precise readings. In addition, the dual 3D sensors, e.g., laser triangulation sensors, may be calibrated at any time; the calibration can be done using NIST traceable thickness standards.

In accordance with the present disclosure, it is also important to distinguish between one-sided and two-sided measurements performed by the present metrology system. For example, the present metrology system may use dual 3D profilers/sensors that enable users to conduct inline measurements and inspections, and run at the low end of their inspection tolerance ranges without crossing any limit thresholds; this increases productivity, improves quality control, and saves time and money on material management. Additional advantages of the present non-destructive, non-contact thickness measurement tool having dual 3D profilers/sensors include the ability to perform continuous thickness measurements, while providing a high degree of accuracy (e.g., 0.1 mm and less).

In another aspect, for one-sided measurements according to the present disclosure, a 3D profiler/sensor may be an optical interferometer if transparent elements are to be scanned using a present thickness measurement tool. For thickness measurements using a present optical interferometer, the elements to be scanned may be made of semiconductor materials or other materials that are transparent to the light wavelength being used and only a single scan of one surface is needed. The light from the optical interferometer will be reflected by the top and bottom surfaces of a scanned element causing interference between the waves of lights. By adjusting the wavelength of the light, a modulated spectral signal may be detected using a spectrometer, and the data used to generate a thickness map since the modulation frequency depends on the object thickness.

Further to this aspect using an optical interferometer, a scanned element may need to be held in place onto a highly planar pedestal or a support platform with a precisely known surface shape (not shown) using a vacuum. It may be necessary to have a bottom surface of the element mateably aligned with a top surface of the pedestal or support platform, whereas nonmating alignment may cause errors. Using a present thickness measurement tool, a thickness measurement may be obtained using one 3D profiler positioned at a top surface of the element.

In an aspect, the present 3D profiler/sensors may have a small detection surface to provide a good resolution of the individual areas of the parts of an element to be measured. In addition, since a non-contact sensor is preferred, there is no need for frequent cleaning and/or replacement. In addition, it is within the scope of the present disclosure to use other optical probes, such as optical fiber sensors, and other types of distance/thickness sensors, such as triangulation sensors, Moire sensors, stereo vision, LiDAR, etc. In a further aspect, the sensors may also be non-light based, such as capacity distance sensors, inductive sensors, etc. In another aspect, it is within the scope of the present disclosure to also use contact sensors that may touch a top surface of an element at designated locations to perform thickness measurements.

In a further aspect shown in FIG. 1, the element 106 may be positioned in the thickness measurement tool 101 by an element handling system 107. The element handling system 107 may be customized to appropriately hold and position the element 106, which may have variations in size and shape, for scanning by either a single or dual 3D profilers/sensors according to the present disclosure. For example, the element handling system 107 may include a belt conveyor, a robotic arm mechanism, a hydraulic lifting system, etc., which may be customized to hold a tray with multiple silicon dies, i.e., a waffle pack.

According to the present disclosure, the metrology system 100 may include the computing device 108 that may be coupled via connection 111 to the thickness measurement tool 101 and the gantry supports 102a and 102b and/or the sensor maneuvering mechanisms 103a and 103b to provide instructions for their movements during a scanning process. It is within the scope of the present disclosure to provide the computing device 108 as a standalone computing device, or an integrated component of the thickness measurement tool 101.

In an aspect, a pre-programmed pattern may be used for the scanning of surfaces of an element and may be stored in the memory device 110, which may be a component of a computing device or situated remotely in a server (not shown). The use of pre-programmed patterns may permit the scans to be performed in an automated process and provide for generating selective scans of greater or lesser details as needed. In an aspect, the pre-programmed pattern may control movements in the x-direction, y-direction, and z-direction, which may be set according to the type and size of a specific element. In yet another aspect, the metrology system 100 may include a user interface (not shown) to provide inputs for the pre-programmed pattern for automated scans, for modifying the automated scans, or for manually scanning of an element.

Figure 2:
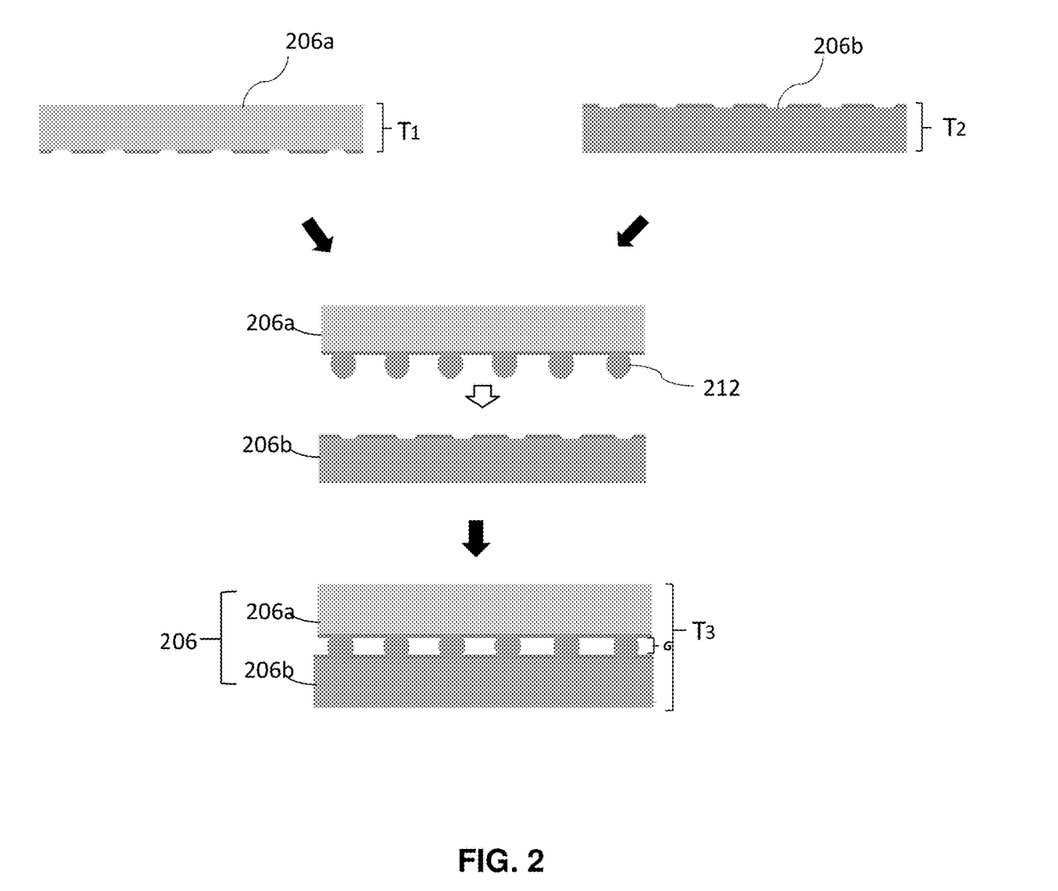
FIG. 2 shows a schematic view of representative elements to be measured using the present metrology system during an assembly process according to another aspect of the present disclosure.

FIG. 2 shows a schematic view of representative elements to be measured using the present metrology system during a semiconductor assembly process according to another aspect of the present disclosure. In this aspect, a principal purpose of the present disclosure is the ability to analyze and/or predict a gap distance between two stacked elements during assembly is shown. The two elements to be stacked may be any combination of silicon chips, substrates, packages, and wafers in the semiconductor industry or may be any two manufactured objects, in general, requiring precision assembling (e.g., aerospace industry, medical equipment industry, automotive industry, etc.).

As shown in FIG. 2, a present method may measure a first thickness measurement ($T_1$) of a first element 206a and a second thickness measurement ($T_2$) of a second element 206b before they are assembled. The present dual 3D profilers may be used to obtain the thickness measurements $T_1$ and $T_2$ by scanning the top and bottom surfaces of elements 206a and 206b, respectively. These thickness measurements may be taken by a single or two different thickness measurement tools depending on the processing flow. In the stacking assembly of the first element 206a to the second element 206b, a plurality of solder balls 212 may be placed on the first element 206a, and a thermal compression bonding or reflow soldering method may be used to bond the first element 206a to the second element 206b to form an assembled or stacked element 206.

In this aspect, an assembled thickness measurement or third thickness measurement ($T_3$) may be obtained for the assembled element 206 using the present dual 3D profilers. A straightforward arithmetic method may be used to calculate gap distances (G) using $T_1$, $T_2$, and $T_3$ for the assembled element 206. According to the present disclosure, a gap map may be generated for analyzing a gap profile for an assembled element based, in part, on the simple formula: $G=T_3-(T_1+T_2)$.

The present metrology system and method generate gap measurement maps based on the differences between the assembled thickness measurements and the sum of the individual first and second thickness measurements. The first, second, and assembled thickness measurements used to generate the first gap measurement map correspond to locations on the first, second, and assembled elements, respectively, that are in vertical alignment so that the thickness measurements overlay each other at their corresponding x-y plane locations as found on the first, second, and assembled elements, respectively.

This methodology may be easily extended to stacking gap analyses for multilayer assemblies. For examples, after a first gap measurement map is generated for an assembled element, a further assembly operation may continue with a third element, which will have its individual thickness measurement performed, and it may be attached to the assembled element followed by a further thickness measurement performed on this stacked assembly with a second gap measurement map generated. This foregoing sequence of steps may be repeated as many times as needed. In many other instances, the actual values for the gap measurements between elements may not be critical, while the gap variations across the assembled elements may be more important. In those instances, a comparison gap measurement map may be generated that is directed to the thickness variations in the measurements of $T_1$, $T_2$, and $T_3$. For example, a first assembled element may have a first gap measurement map and a second assembled element may have a second gap measurement map, and a computing device may be tasked with generating a comparison gap measurement map.

In the semiconductor industry, many situations require knowledge of the gaps between two specific elements. For example, during the assembly process, there are chip gaps at a first level interconnect (FLI), a medium level interconnect (MLI) and a second level interconnect (SLI) that may need to be measured and analyzed. At those interconnects, it may be critically important to know the gap distances and have them properly characterized, because gap distances that are mischaracterized may lead to defects, such as solder ball bridging and non-contact openings. In an aspect, the present metrology system and method may be used to generate gap measurement maps at the first, medium, and second level interconnects.

In particular, chip gap distances are especially relevant at FLIs, due to their fine bump pitches (~50 μm) and small chip gaps (~30 μm), which is a critical input parameter for capillary underfill (CUF) using epoxy. The chip gap distance and other parameters, such as bump pitches and bump diameters/volumes, will determine the epoxy volume required as underfill. In addition, if there are significant variations in chip gap distances between assembled elements, such variations may affect product quality and yields to ensure that the CUF process step is properly performed. This concern may also apply to Mils and SLIs, as process assembly steps that are downstream from FLIs and may require CUF using epoxy.

Figure 3A:
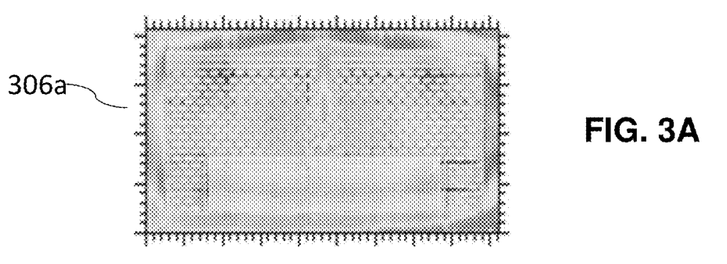
FIGS. 3A, 3B, and 3C show representative scanned measurements of pre-assembled and assembled elements using the present metrology system according to yet another aspect of the present disclosure.
Figure 3B:
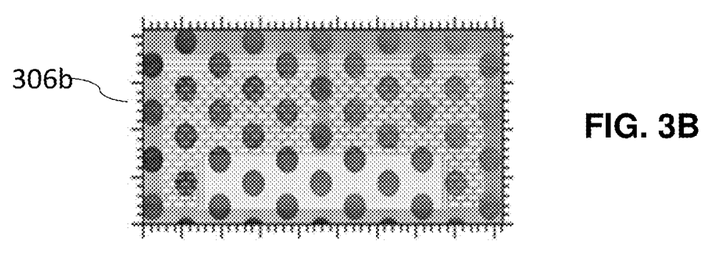
Figure 3C:
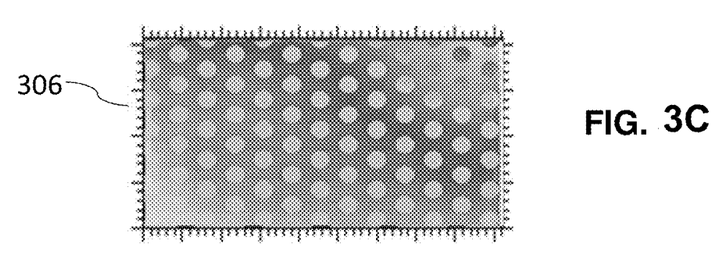

FIGS. 3A, 3B, and 3C show representative scanned measurements of pre-assembled and assembled elements using the present metrology system according to yet another aspect of the present disclosure. In an aspect, as it relates to high bandwidth memory (HBM) chip gap measurements, the present metrology system and methodology may be especially attractive, since conventional 3D X-ray methods may be destructive due to the radiative damage to the DRAM structures in HBM products, which place memory dies in proximity to the processors.

In FIG. 3A, a thickness map for an HBM die 306a, which may be generated using a thickness measurement tool according to the present disclosure, is shown, and the map shows a mean thickness approximately 700 μm and a thickness variation of about 5 μm. In FIG. 3B, a thickness map for an organic substrate 306b, which may be generated using a thickness measurement tool according to the present disclosure, is shown, and the map shows a mean thickness of this substrate is approximately 2000 μm. In FIG. 3C, a thickness map for an assembled package 306, i.e., the HBM die 306a and substrate 306b, which may be generated using a thickness measurement tool according to the present disclosure, is shown, and the map shows a mean thickness of the assembled package 306 is approximately 2800 μm. Therefore, in this representative example, a calculated estimated mean chip gap measurement may be approximately 50 μm, which is for a gap distance defined as being between a solder resist surface (between bumps) on the substrate to the die surface (between bumps). The present metrology system that was used had an x-y spatial resolution of approximately 5 μm and approximately 100 nm for the thickness measurements.

Figure 4A:
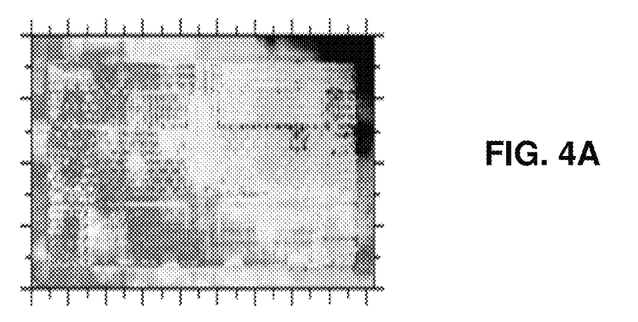
FIGS. 4A and 4B show representative chip gap maps from measurements taken using the present metrology system according to further aspects of the present disclosure.
Figure 4B:
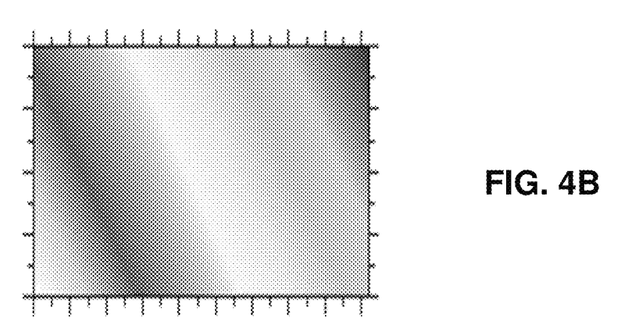

FIGS. 4A and 4B show representative chip gap maps from measurements taken using the present metrology system according to a further aspect of the present disclosure. In FIG. 4A, a bump level chip gap map is shown, and in FIG. 4B, a linear fit version of the chip gap map shows a die tilt relative to the substrate. In particular, the tilt was approximately 0.75 μm/mm and 0.5 μm/mm in horizontal and vertical directions, respectively. It is also possible to use the chip gap measurement maps to analyze the possible root causes of the tilt, which may include substrate/die warpage during bonding, temperature non-uniformity, etc.

Figure 5A:
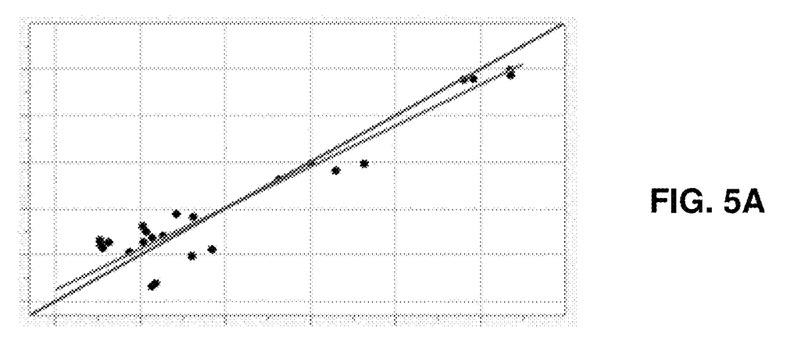
FIGS. 5A and 5B show correlations between gap measurements obtained by the present metrology system as compared with a 3D X-ray system.
Figure 5B:
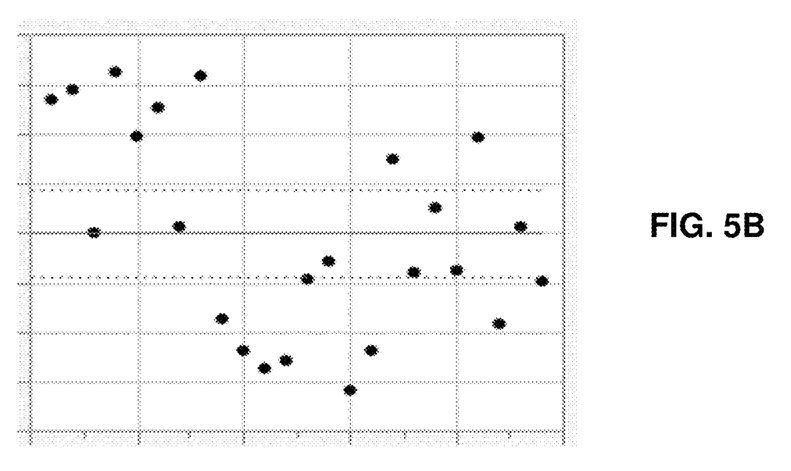

FIGS. 5A and 5B show correlations between gap measurements obtained by the present metrology system as compared with a 3D X-ray method. In FIG. 5A, a graphical representation shows that these two methods are highly correlated with an R-squared value of 0.9025. In addition, as shown in FIG. 5B, the difference between the two methods is within 2 μm for all 24 fields of vision taken for the 3D X-ray method, which is insignificant.

Figure 6:
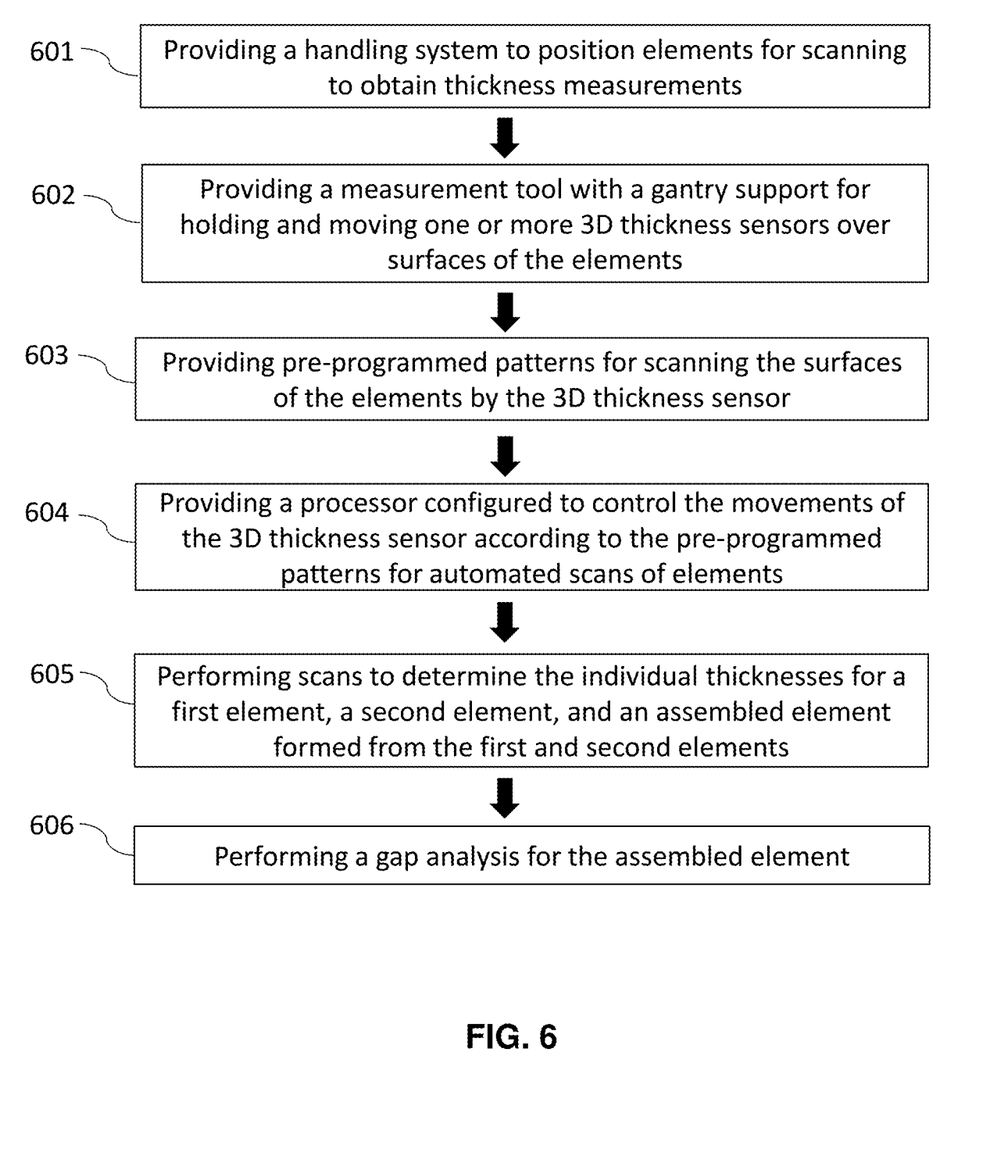
FIG. 6 shows a simplified flow diagram for an exemplary method according to an aspect of the present disclosure.

FIG. 6 shows a simplified flow diagram for an exemplary method according to an aspect of the present metrology system.

The operation 601 may be directed to providing a handling system to position elements for scanning to obtain thickness measurements.

The operation 602 may be directed to providing a measurement tool with a gantry support for holding and moving one or more 3D thickness sensors over surfaces of the elements.

The operation 603 may be directed to providing pre-programmed patterns for scanning the surfaces of the elements by the 3D thickness sensor.

The operation 604 may be directed to providing a processor configured to control the movements of the 3D thickness sensor according to the pre-programmed pattern for an automated scan.

The operation 605 may be directed to performing scans to determine the individual thicknesses for a first element, a second element, and an assembled element formed from the first and second elements.

The operation 605 may be directed to performing a gap analysis for the assembled element.

It will be understood that any property described herein for a specific tool may also hold for any tool or system described herein. It will also be understood that any property described herein for a specific method may hold for any of the methods described herein. Furthermore, it will be understood that for any tool, system, or method described herein, not necessarily all the components or operations described will be enclosed in the tool, system, or method, but only some (but not all) components or operations may be enclosed.

To more readily understand and put into practical effect the present metrology system and methods for their use in gap measurements, they will now be described by way of examples. For the sake of brevity, duplicate descriptions of features and properties may be omitted.

EXAMPLES

Example 1 provides a method including determining first thickness measurements for a first element, determining second thickness measurements for a second element, assembling the first element over the second element to form an assembled element, for which the assembled element includes a first gap between the first and second elements, determining assembled thickness measurements for the assembled element, and generating a first gap measurement map based on the differences between the assembled thickness measurements and the sum of the individual first and second thickness measurements, for which the first, second, and assembled thickness measurements used to generate the first gap measurement map correspond to locations on the first, second, and assembled elements, respectively, that are in vertical alignment.

Example 2 may include the method of example 1 and/or any other example disclosed herein, further includes using a pair of 3-dimensional profilers to simultaneously scan top surfaces and bottom surfaces of the first element, second element, and assembled element, respectively, to determine the first thickness measurements, the second thickness measurements, and the assembled thickness measurements.

Example 3 may include the method of example 1 and/or any other example disclosed herein, further includes using a single 3-dimensional profiler to sequentially scan top surfaces and bottom surfaces of the first element, second element, and assembled element, respectively, to determine the first thickness measurements, the second thickness measurements, and the assembled thickness measurements.

Example 4 may include the method of example 1 and/or any other example disclosed herein, further includes using at least one optical interferometer to scan surfaces of the first element, second element, and assembled element, respectively, to determine the first thickness measurements, the second thickness measurements, and the assembled thickness measurements, for which the first element, second element, and assembled element are transparent elements and positioning the first element, the second element, and the assembled element, respectively, on a planar surface for the scans.

Example 5 may include the method of example 1 and/or any other example disclosed herein, further includes determining third thickness measurements for a third element, determining fourth thickness measurements for a fourth element, assembling the third element over the fourth element to form a second assembled element, for which the second assembled element includes a second gap between the third and fourth elements, determining second assembled thickness measurements for the second assembled element, generating a second gap measurement map based on the difference between the second assembled thickness measurements and the sum of the individual third and fourth thickness measurements, and comparing the first and second gap measurement maps.

Example 6 may include the method of example 1 and/or any other example disclosed herein, for which the first element further includes a semiconductor device, for which the second element further includes a package substrate, and the first gap measurement map is for a first level interconnect.

Example 7 may include the method of example 1 and/or any other example disclosed herein, for which the first element further includes an assembled semiconductor package, for which the second element further includes a printed circuit board, and the first gap measurement map is for a second level interconnect.

Example 8 may include the method of example 1 and/or any other example disclosed herein, for which the first element further includes a semiconductor chip lid, and for which the second element further includes an assembled semiconductor package.

Example 9 provide a metrology system including an element handling system for positioning elements for thickness measurements, a thickness measurement tool including at least one 3-dimensional thickness sensor configured to obtain thickness measurements for a first element and a second element, respectively, and configured to obtain assembled thickness measurements for an assembled element, for which the assembled element includes the first element and the second element, and a computing device coupled to the thickness measurement tool and the 3-dimensional thickness sensor, and for which the computing device is configured to provide data relating to the difference between the assembled thickness measurements and the sum of the individual first and second thickness measurements, and the data is used to generate gap measurement maps.

Example 10 may include the metrology system of example 9 and/or any other example disclosed herein, for which the at least one 3-dimensional thickness sensor further includes dual 3-dimensional thickness sensors.

Example 11 may include the metrology system of example 9 and/or any other example disclosed herein, for which the at least one 3-dimensional thickness sensor further includes a single 3-dimensional thickness sensor.

Example 12 may include the metrology system of example 9 and/or any other example disclosed herein, for which the at least one 3-dimensional thickness sensor further includes an optical interferometer for obtaining thickness measurement when the first element, the second element, and/or the assembled element are transparent elements.

Example 13 may include the metrology system of example 9 and/or any other example disclosed herein, for which the thickness measurement tool further includes at least one gantry support with a sensor maneuvering mechanism.

Example 14 may include the metrology system of example 9 and/or any other example disclosed herein, for which the computing device further includes a controller and memory device.

Example 15 provides a including providing inline inspection of an semiconductor assembly including conveying a first element to a first thickness measurement tool with at least one first 3-dimensional thickness sensor and scanning the first element using the first 3-dimensional thickness sensor to obtain thickness measurements for the first element, conveying a second element to a second thickness measurement tool with at least one second 3-dimensional thickness sensor and scanning the second element using the second 3-dimensional thickness sensor to obtain thickness measurements for the second element, conveying an assembled element to a third thickness measurement tool with at least one third 3-dimensional thickness sensor and scanning the assembled element using the third 3-dimensional thickness sensor to obtain a thickness measurement for the assembled element, for which the assembled element is formed by a stacking the first and second elements and a gap is formed between the first and second elements during the stacking.

Example 16 may include the method of example 15 and/or any other example disclosed herein, further includes storing the thickness measurements for the first and second elements and the assembled element in a memory device, and providing a computing device coupled to the memory device for determining gap measurements for the gap based on the difference between the thickness measurements for the assembled element and the sum of the individual thickness measurements for first and second elements and generating gap measurement maps for the inspection of the semiconductor assembly.

Example 17 may include the method of example 15 and/or any other example disclosed herein, for which the first, second, and third thickness measurement tools are the same thickness measurement tool being operated to measure the thicknesses for the first element, second element, and the assembled element at different times.

Example 18 may include the method of example 15 and/or any other example disclosed herein, for which each of the 3-dimensional thickness sensors further includes a pair of 3-dimensional profilers that are used to simultaneously scan top surfaces and bottom surfaces of the first element, second element, and assembled element, respectively, to determine the first thickness measurement, the second thickness measurement, and the assembled thickness measurement.

Example 19 may include the method of example 15 and/or any other example disclosed herein, for which each of the 3-dimensional thickness sensors further includes a single 3-dimensional profiler that is used to sequentially performs a first scan of a top surface and a second scan of a bottom surface of the first element, a first scan of a top surface and a second scan of a bottom surface of the second element, and a first scan of a top surface and a second scan of a bottom surface of the assembled element, respectively, to determine the first thickness measurement, the second thickness measurement, and the assembled thickness measurement.

Example 20 may include the method of example 15 and/or any other example disclosed herein, for which each of the 3-dimensional thickness sensors further includes at least one optical interferometer that is used to scan surfaces of the first element, the second element, and the assembled element, respectively, to determine the first thickness measurements, the second thickness measurements, and the assembled thickness measurements, for which the first element, second element, and assembled element are transparent elements and positioning the first element, the second element, and the assembled element, respectively, on a planar surface for the scans.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

The terms "and" and "or" herein may be understood to mean "and/or" as including either or both of two stated possibilities.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A method comprising:
   determining first thickness measurements for a first element prior to assembling the first element with a second element;
   determining second thickness measurements for the second element prior to assembling the second element with the first element;
   assembling the first element over the second element to form an assembled element, wherein the assembled element comprises a first gap between the first and second elements;
   determining assembled thickness measurements for the assembled element; [and]
   generating a first gap measurement map based on the differences between the assembled thickness measurements and the sum of the individual first and second thickness measurements, wherein the first, second, and assembled thickness measurements used to generate the first gap measurement map correspond to locations on the first, second, and assembled elements, respectively, that are in vertical alignment;
   determining third thickness measurements for a third element
   determining fourth thickness measurements for a fourth element
   assembling the third element over the fourth element to form a second assembled element, wherein the second assembled element comprises a second gap between the third and fourth elements;
   determining second assembled thickness measurements for the second assembled element;
   generating a second gap measurement map based on the difference between the second assembled thickness measurements and the sum of the individual third and fourth thickness measurements; and
   comparing the first and second gap measurement maps.

2. The method of claim 1, further comprises:
   using a pair of 3-dimensional profilers to simultaneously scan top surfaces and bottom surfaces of the first element, second element, and assembled element, respectively, to determine the first thickness measurements, the second thickness measurements, and the assembled thickness measurements.

3. The method of claim 1, further comprises:
   using a single 3-dimensional profiler to sequentially scan top surfaces and bottom surfaces of the first element, second element, and assembled element, respectively, to determine the first thickness measurements, the second thickness measurements, and the assembled thickness measurements.

4. The method of claim 1, further comprises:
using at least one optical interferometer to scan surfaces of the first element, second element, and assembled element, respectively, to determine the first thickness measurements, the second thickness measurements and the assembled thickness measurements, wherein the first element, second element, and assembled element are transparent elements; and
positioning the first element, the second element, and the assembled element, respectively, on a planar surface for the scans.

5. The method of claim 1, wherein the first element further comprises a semiconductor device;
wherein the second element further comprises a package substrate; and
the first gap measurement map is for a first level interconnect.

6. The method of claim 1, wherein the first element further comprises an assembled semiconductor package;
wherein the second element further comprises a printed circuit board; and
the first gap measurement map is for a second level interconnect.

7. The method of claim 1, wherein the first element further comprises a semiconductor chip lid; and
wherein the second element further comprises an assembled semiconductor package.

8. A metrology system comprising:
an element handling system for positioning elements for thickness measurements;
a thickness measurement tool comprising at least one 3-dimensional thickness sensor configured to obtain [thickness measurements] a first thickness measurement for a first element and a second thickness measurement for a second element representative of a thickness of the first element and the second element prior to an assembling of the first element with the second element, respectively, and configured to obtain first assembled thickness measurements for an assembled element, wherein the assembled element comprises the first element and the second element,
wherein the at least one 3-dimensional thickness sensor is further configured to obtain a third thickness measurement for a third element and a fourth thickness measurement for a fourth element representative of a thickness of the third element and the fourth element prior to an assembling of the third element with the fourth element, respectively, and is further configured to obtain second assembled thickness measurements for a second assembled element, wherein the second assembled element comprises the third element and the fourth element; and
a computing device coupled to the thickness measurement tool and the 3-dimensional thickness sensor, and wherein the computing device is configured to provide data relating to the difference between the assembled thickness measurements and the sum of the individual first and second thickness measurements, and the data is used to generate a first gap measurement map[s]s,
wherein the computing device is further configured to provide further data relating to the difference between the second assembled thickness measurements and the sum of the individual third and fourth thickness measurements, and the further data is used to generate a second gap measurement map, and
wherein the computing device is further configured to compare the first and second gap measurement maps.

9. The metrology system of claim 8, wherein the at least one 3-dimensional thickness sensor further comprises dual 3-dimensional thickness sensors.

10. The metrology system of claim 8, wherein the at least one 3-dimensional thickness sensor further comprises a single 3-dimensional thickness sensor.

11. The metrology system of claim 8, wherein the at least one 3-dimensional thickness sensor further comprises an optical interferometer for obtaining thickness measurement when the first element, the second element, and/or the assembled element are transparent elements.

12. The metrology system of claim 8, wherein the thickness measurement tool further comprises at least one gantry support with a sensor maneuvering mechanism.

13. The metrology system of claim 8, wherein the computing device further comprises a controller and memory device.

14. A method comprising:
providing inline inspection of a semiconductor assembly comprising:
conveying a first element to a first thickness measurement tool with at least one first 3-dimensional thickness sensor and scanning the first element using the first 3-dimensional thickness sensor to obtain thickness measurements for the first element;
conveying a second element to a second thickness measurement tool with at least one second 3-dimensional thickness sensor and scanning the second element using the second 3-dimensional thickness sensor to obtain thickness measurements for the second element;
conveying an assembled element to a third thickness measurement tool with at least one third 3-dimensional thickness sensor and scanning the assembled element using the third 3-dimensional thickness sensor to obtain a thickness measurement for the assembled element, wherein the assembled element is formed by stacking the first and second elements and a gap is formed between the first and second elements during the stacking.

15. The method of claim 14, further comprises;
storing the thickness measurements for the first and second elements and the assembled element in a memory device; and
providing a computing device coupled to the memory device for determining gap measurements for the gap based on the difference between the thickness measurements for the assembled element and the sum of the individual thickness measurements for first and second elements and generating gap measurement maps for the inspection of the semiconductor assembly.

16. The method of claim 14, wherein the first, second, and third thickness measurement tools are the same thickness measurement tool being operated to measure the thicknesses for the first element, second element, and the assembled element at different times.

17. The method of claim 14, wherein each of the 3-dimensional thickness sensors further comprises a pair of 3-dimensional profilers that are used to simultaneously scan top surfaces and bottom surfaces of the first element, second element, and assembled element, respectively, to determine the first thickness measurement, the second thickness measurement, and the assembled thickness measurement.

18. The method of claim 14, wherein each of the 3-dimensional thickness sensors further comprises a single 3-dimensional profiler that is used to sequentially performs a first scan of a top surface and a second scan of a bottom surface of the first element, a first scan of a top surface and a second scan of a bottom surface of the second element, and a first scan of a top surface and a second scan of a bottom surface of the assembled element, respectively, to determine the first thickness measurement, the second thickness measurement, and the assembled thickness measurement.

19. The method of claim 14, wherein each of the 3-dimensional thickness sensors further comprises at least one optical interferometer that is used to scan surfaces of the first element, the second element, and the assembled element, respectively, to determine the first thickness measurements, the second thickness measurements, and the assembled thickness measurements, wherein the first element, second element, and assembled element are transparent elements; and positioning the first element, the second element, and the assembled element, respectively, on a planar surface for the scans.

* * * * *